US006025234A

United States Patent [19]

Chou

[11] Patent Number: 6,025,234

[45] Date of Patent: Feb. 15, 2000

[54] METHOD FOR MANUFACTURING THICK GATE OXIDE DEVICE

[75] Inventor: Jih-Wen Chou, Hsinchu, Taiwan

[73] Assignee: United Microelectronics Corp., Hsin-Chu, Taiwan

[21] Appl. No.: 08/992,675

[22] Filed: Dec. 17, 1997

[30] Foreign Application Priority Data

Sep. 26, 1997 [TW] Taiwan ................................ 86114038

[51] Int. Cl.[7] .................................................. H01L 21/336

[52] U.S. Cl. .......................... 438/279; 438/221; 438/257; 438/931

[58] Field of Search .................................... 438/221, 275, 438/296, 587, 757

[56] References Cited

U.S. PATENT DOCUMENTS 5,502,009 3/1996 Lin et al. ................................ 438/275
5,595,922 1/1997 Tigelaar et al. ......................... 438/587
5,885,903 3/1999 Torek et al. ............................ 438/756

*Primary Examiner*—Charles Bowers
*Assistant Examiner*—William M. Brewster
*Attorney, Agent, or Firm*—Finnegan, Henderson, Farabow, Garrett & Dunner, L.L.P.

[57] ABSTRACT

A method for forming devices having a thick gate oxide. The method comprises the steps of providing a substrate having different device areas already defined thereon through shallow trench isolation, then forming a first gate oxide layer over the substrate. Next, a silicon nitride layer is formed over the first gate oxide layer, then patterned using a mask to selectively expose the first gate oxide layer in the thick gate oxide area. Subsequently, a thermal oxidation is performed to directly grow an oxide layer over the first gate oxide layer to form a thicker second gate oxide layer. Since no gate oxide layer is removed in this invention, the distribution of ions implanted in previous processing steps will remain unchanged. Therefore, the fabricated devices will have more stable properties and better reliability.

15 Claims, 2 Drawing Sheets

27
28
24
20
21
22
23

METHOD FOR MANUFACTURING THICK GATE OXIDE DEVICE

BACKGROUND OF THE INVENTION

1. Field of Invention

The present invention relates to a method for manufacturing devices that have a thick gate oxide. More particularly, the present invention relates to a method for forming gate oxide having different thickness over the input/output device area and core device area through thermal oxidation processes.

2. Description of Related Art

Advances in integrated circuit fabricating techniques have reduced the dimensions of semiconductor devices continuously. Consequently, the gate dielectric and gate oxide layers of a field effect transistor are becoming thinner and thinner. Although a thin gate oxide layer allows device dimensions to be reduced, a lower operational voltage source is needed. Since the external voltage is not low enough to directly supply the miniaturized internal devices, a certain number of devices having a thicker gate oxide layer must be used as a medium for linking with external voltage source. Through these specially thickened gate oxide devices, a high voltage can be gradually transformed into a lower operational voltage suitable for use in ordinary devices, which have a thin gate oxide layer. Therefore, a method for fabricating integrated circuit devices having a thick gate oxide is invented.

In the manufacture of gate oxide layer, usually the double thickness gate oxide layer is used for covering the input/output (I/O) devices, while the thinner gate oxide layer is formed over the core devices. In a conventional method, a first gate oxide layer is usually formed over a substrate in the beginning. FIGS. 1A through 1C are cross-sectional views showing the progression of manufacturing steps in forming a thin and a thick gate oxide layer over a substrate in a conventional method. First, as shown in FIG. 1A, shallow trench isolation 11 is formed over the silicon substrate 10 for separating the input/output device area 12 and core device area 13. Then, an oxidation reaction is conducted to form a first gate oxide layer 14 over the device areas above the silicon substrate 10. Subsequently, a photoresist layer 15 is formed over the device areas. Then, the photoresist layer 15 is patterned to remove the photoresist layer above the core device area 13 using photolithographic and etching processes, and obtained a structure as shown in FIG. 1A.

Next, as shown in FIG. 1B, the first gate oxide layer that is not covered by the photoresist layer 15 is completely etched away. Subsequently, the photoresist layer 15 is also removed forming a cross-sectional structure as shown in FIG. 1B. Thereafter, as shown in FIG. 1C, another oxidation reaction is carried out to form a second gate oxide layer 16. The second gate oxide layer 16 may or may not be of the same thickness as the first gate oxide layer 14. Hence, two gate oxide layers, namely, the first gate oxide layer 14 and the second gate oxide layer 16, are formed above the input/output device area 12. On the other hand, only one gate oxide layer, namely, the second gate oxide layer 16, are formed above the core device area 13. Consequently, different device areas will have different gate oxide layer thickness, and therefore able to provide the characteristics each type of devices demand.

However, before depositing any gate oxide layers, a number of prior steps required for creating the necessary device characteristics in different device areas are usually performed. For example, threshold voltage can be adjusted through controlling the level and concentration of ions doped into the substrate. However, the heat generated by the first thermal oxidation can easily make ions out-diffuse into the first gate oxide layer, this is especially serious when one of the doped ions is boron. Consequently, since a portion of the first gate oxide layer is etched away, some of the out-diffused ions will be carried away along with the gate oxide material. This will result in a change in the distribution of level and concentration for the doped ions, thereby leading to a change in the threshold voltage characteristic. Because it is very difficult to estimate the effect of gate oxide etching on the amount of doped ions removed, uniform device properties are difficult to get.

In light of the foregoing, there is a need in the art to provide a better method for forming a double thickness gate oxide layer.

SUMMARY OF THE INVENTION

Accordingly, the present invention is directed to provide a method for forming devices having a thick gate oxide such that suitable gate oxide thickness is formed over different device area. This invention opts for forming an oxide layer directly above a first gate oxide layer in selected areas using a thermal oxidation process, which results in the formation of a thicker second gate oxide layer. Because there is no etching to remove thermally oxidized oxide layer, for example, the first gate oxide layer, the quantity of ions implanted into the substrate during a previous implantation operation will not be affected. Consequently, characteristic properties of the devices can be maintained and the reliability of the devices is increased.

To achieve these and other advantages and in accordance with the purpose of the invention, as embodied and broadly described herein, the invention provides a method for forming a device having a thick gate oxide. The method comprises the steps performing a thermal oxidation to form a first gate oxide layer over the device area of a substrate, then depositing a silicon nitride layer over the first gate oxide layer. Thereafter, the silicon nitride layer is patterned, and portions of the silicon nitride layer above the input/output device area is removed, for example, using hot sulfuric acid solution. Next, oxide is deposited as an extension over the gate oxide layer that lies above the input/output device area to form a thicker gate oxide layer. Subsequently, the thick gate oxide layer is patterned to form a second gate oxide layer. Finally, the silicon nitride layer above the core device area is removed to complete the formation of gate oxide of different thickness in different device area. Since no gate oxide layer is removed in this invention, the quantities of implanted ions remain unchanged. Therefore, the fabricated devices will have more stable properties and better reliability.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
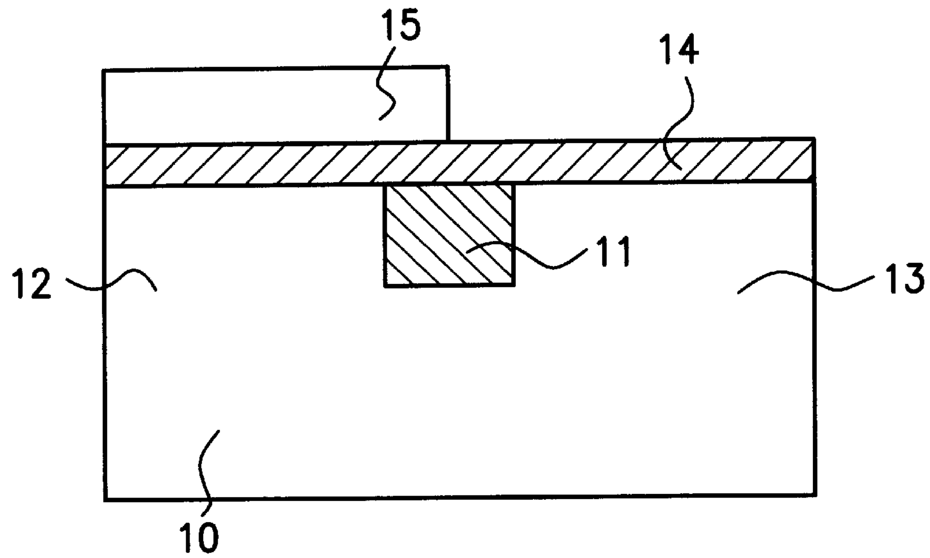
FIG. 1A is a cross-sectional view showing a device structure after patterning a photoresist layer with a mask and removing portions of the photoresist layer in a conventional method.
Figure 1B:
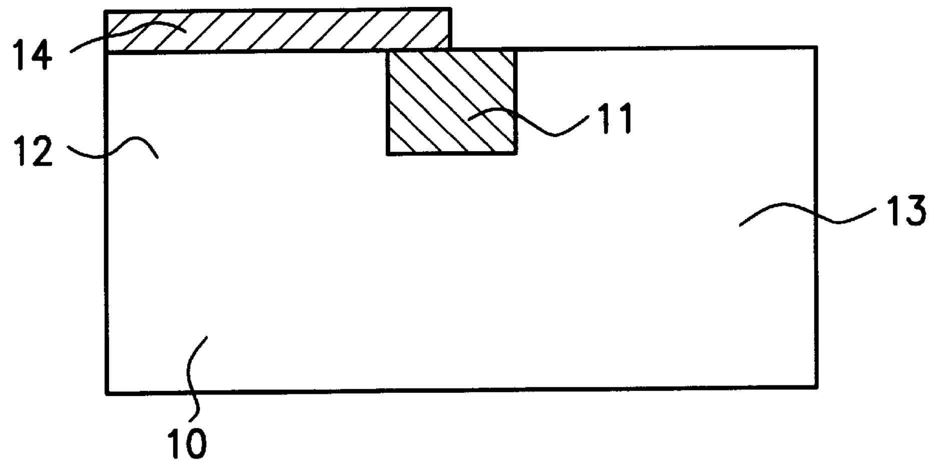
FIG. 1B is a cross-sectional view showing a device structure after etching away the first gate oxide layer above the core device area in a conventional method.
Figure 1C:
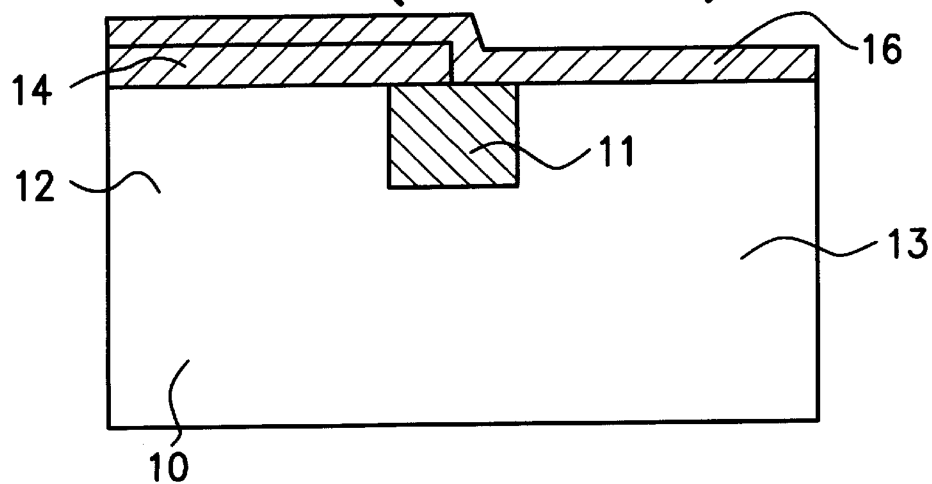
FIG. 1C is a cross-sectional view showing a device structure after forming another gate oxide layer over the original gate oxide layer in a conventional method, thus creating different gate oxide thickness over different device area.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
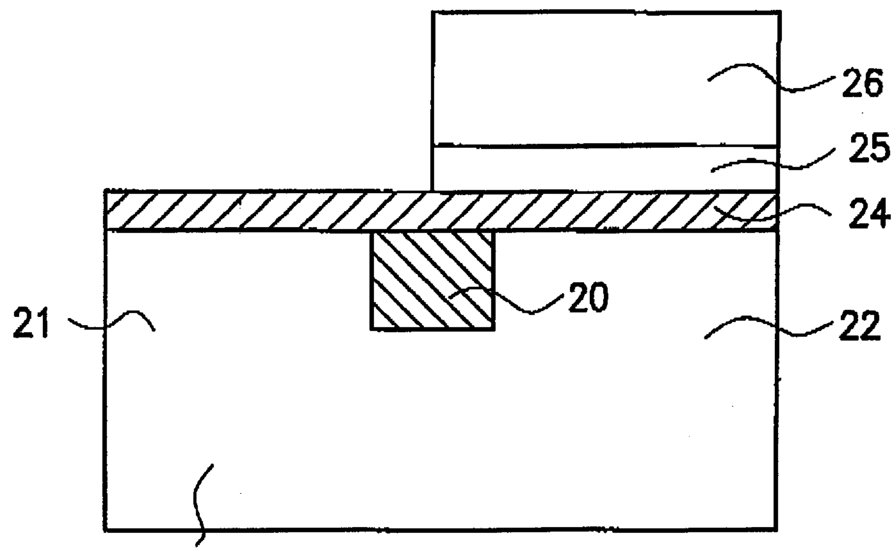
FIG. 2A is a cross-sectional view showing a device structure after patterning a photoresist layer with a mask and removing portions of the silicon nitride layer according to one preferred embodiment of this invention.

FIG. 2A is a cross-sectional view showing a device structure after patterning a photoresist layer with a mask and removing portions of the silicon nitride layer according to one preferred embodiment of this invention. First, shallow trench isolation 20 is formed to separate an input/output device area 21 from a core device area 22 on a substrate 23. Then, a first gate oxide layer 24 is formed over the substrate 23 using a thermal oxidation process. Subsequently, a silicon nitride layer 25 is formed over the first gate oxide layer 24. The silicon nitride layer 25 is formed, for example, using a chemical vapor deposition method and preferably has a thickness of about 500 Å to 1000 Å. Next, a layer of photoresist 26 is formed over the silicon nitride layer 25. Then, the photoresist layer 26 is patterned by a photomask, and portions of the photoresist layer 26 that lies above the input/output device area 21 is removed. This is followed by removing the silicon nitride layer 25 above the input/output device area 21 to form the cross-sectional structure as shown in FIG. 2A.

Figure 2B:
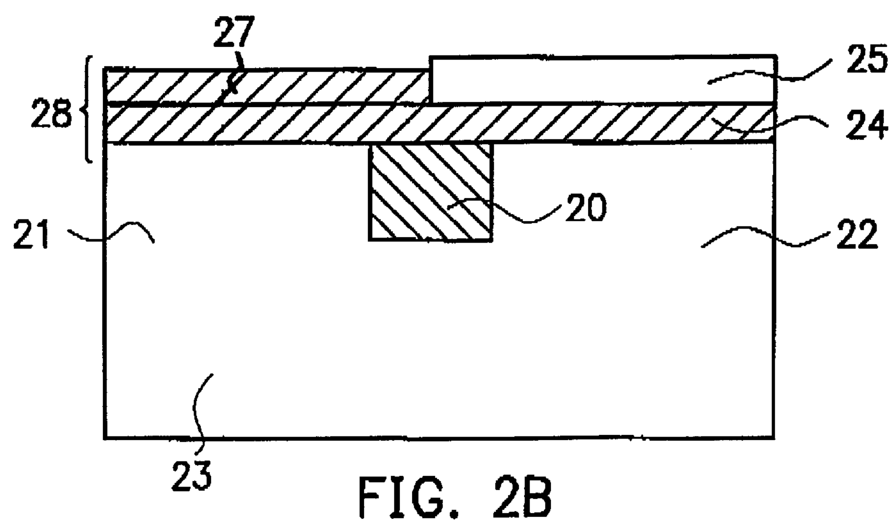
FIG. 2B is a cross-sectional view showing a device structure after forming a thicker gate oxide layer over the input/output device area according to one preferred embodiment of this invention.
Figure 2C:
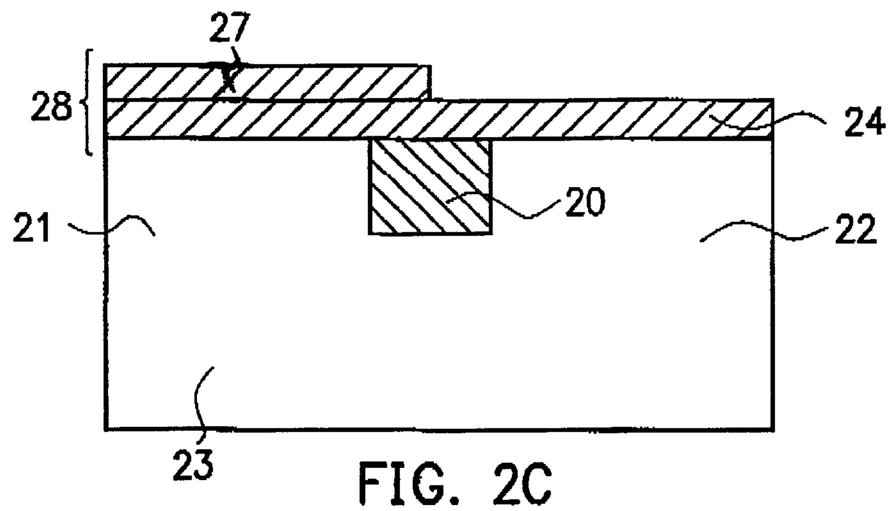
FIG. 2C is a cross-sectional view showing the complete device structure according to one preferred embodiment of this invention.

Next, as shown in FIG. 2B, a thermal oxidation is carried out to deposit an oxide layer 27 above the first gate oxide layer 24 in the input/output device area 21. The first gate oxide layer 24 together with the oxide layer 27 constitute a second gate oxide layer 28. Finally, the silicon nitride layer 25 above the core device area 22 is removed to form the structure as shown in FIG. 2C. Consequently, the core device area 22 is covered by a first gate oxide layer 24, and the input/output device area 21 is covered by a thicker second gate oxide layer 28. The thicker second gate oxide layer 28 is actually a layer formed by combining the first gate oxide layer 24 and the oxide layer 27.

Therefore, the characteristic of this invention is the utilization of a photoresist layer to put a layer of silicon nitride over the first gate oxide layer above the core device area. Then, a thermal oxidation is conducted to form an additional oxide layer over the exposed first gate oxide in the input/output device area, thus establishing a thicker second gate oxide layer. Finally, the silicon nitride layer above the core device area is removed.

Since the thicker gate oxide layer is formed by the selective covering of specified area by a silicon nitride layer followed by a thermal oxidation, no etching of the gate oxide layer is required in subsequent processes. Therefore, the quantities of implanted ions remain unchanged, and the fabricated devices will have more stable properties and better reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming devices having a thick gate oxide, such that thin gate oxide devices and thick gate oxide devices are formed respectively over a first device area and a second device area previously defined on a substrate, comprising the steps of:

- forming a first gate oxide layer over the substrate;
- depositing a silicon nitride layer over the first gate oxide layer;
- depositing a photoresist layer over the silicon nitride layer;
- patterning the photoresist layer with a mask, then etching away portions of the silicon nitride layer to expose the entire first gate oxide layer above the second device area;
- thermally growing an oxide layer over the first gate oxide layer in the second device area such that the thermally grown oxide layer together with the first gate oxide layer forms a second gate oxide layer; and
- removing the silicon nitride layer above the first device area.

2. The method of claim 1, wherein the step of forming the first gate oxide layer includes using a thermal oxidation process.

3. The method of claim 1, wherein the step of forming the silicon nitride layer includes using a chemical vapor deposition method.

4. The method of claim 1, wherein the silicon nitride layer has a thickness preferably about 500 Å to 1000 Å.

5. The method of claim 1, wherein the second gate oxide layer has a thickness greater than the first gate oxide layer.

6. The method of claim 1, wherein the first device area comprises core devices.

7. The method of claim 1, wherein the second device area comprises input/output devices.

8. A method for forming devices having a thick gate oxide, such that thin gate oxide devices and thick gate oxide devices are formed respectively over a first device area and a second device area previously defined on a substrate, comprising the steps of:

- forming a first gate oxide layer over the substrate using a thermal oxidation process;
- depositing a silicon nitride layer over the first gate oxide layer using a chemical vapor deposition method;
- depositing a photoresist layer over the silicon nitride layer;
- patterning the photoresist layer with a mask for exposing portions of the silicon nitride layer;
- etching away portions of the silicon nitride layer by using hot sulfuric acid to expose the entire first gate oxide layer in the second device area;

growing an oxide layer over the first gate oxide layer in the second device area using a thermal oxidation process such that the thermally grown oxide layer together with the first gate oxide layer forms a second gate oxide layer; and removing the silicon nitride layer above the first device area.

9. The method of claim 8, wherein the silicon nitride layer has a thickness preferably about 500 Å to 1000 Å.

10. The method of claim 8, wherein the first device area comprises core devices.

11. The method of claim 8, wherein the second device area comprises input/output devices.

12. A method for forming devices having a thick gate oxide, such that thin gate oxide devices and thick gate oxide devices are formed respectively over a first device area and a second device area previously defined on a substrate, comprising the steps of:

forming a first gate oxide layer over the substrate using a thermal oxidation process;

depositing a silicon nitride layer directly on the first gate oxide layer using a chemical vapor deposition method;

depositing a photoresist layer over the silicon nitride layer;

patterning the photoresist layer with a mask for exposing portions of the silicon nitride layer;

etching away the portions of the silicon nitride layer by using hot sulfuric acid to expose the entire first gate oxide layer in the second device area;

growing an oxide layer over the first gate oxide layer in the second device area using a thermal oxidation process such that the thermally grown oxide layer together with the first gate oxide layer forms a second gate oxide layer; and removing the silicon nitride layer above the first device area.

13. The method for forming devices having a thick gate oxide according to claim 12, wherein the step of removing the silicon nitride layer above the first device area removes the entire silicon nitride layer above the first device area.

14. The method for forming devices having a thick gate oxide according to claim 1, wherein the step of removing the silicon nitride layer above the first device area removes the entire silicon nitride layer above the first device area.

15. The method for forming devices having a thick gate oxide according to claim 8, wherein the step of removing the silicon nitride layer above the first device area removes the entire silicon nitride layer above the first device area.

* * * * *